United States Patent
Bloom et al.

(10) Patent No.: US 9,057,642 B2
(45) Date of Patent: Jun. 16, 2015

(54) METHOD AND APPARATUS FOR CALIBRATING A DISPENSER

(71) Applicant: Illinois Tool Works Inc., Glenview, IL (US)

(72) Inventors: Jonathan Joel Bloom, North Falmouth, MA (US); Thomas J. Karlinski, Atkinson, NH (US); Traci Anne Shultz, Medway, MA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 263 days.

(21) Appl. No.: 13/692,057

(22) Filed: Dec. 3, 2012

(65) Prior Publication Data

US 2014/0150518 A1    Jun. 5, 2014

(51) Int. Cl.
*G01G 23/01* (2006.01)
*H05K 13/04* (2006.01)

(52) U.S. Cl.
CPC ............ *G01G 23/01* (2013.01); *H05K 13/0469* (2013.01)

(58) Field of Classification Search
CPC . G01G 23/01; G01G 23/012; G01G 23/3728; G01G 23/3735
USPC .......................................................... 73/1.13
See application file for complete search history.

(56) References Cited

U.S. PATENT DOCUMENTS

| | | |
|---|---|---|
| 5,044,900 A | 9/1991 | Cavallaro |
| 5,795,390 A | 8/1998 | Cavallaro |
| 5,819,983 A | 10/1998 | White et al. |
| 5,837,892 A | 11/1998 | Cavallaro et al. |
| 5,886,494 A | 3/1999 | Prentice et al. |
| 5,903,125 A | 5/1999 | Prentice et al. |
| 5,918,648 A | 7/1999 | Carr et al. |
| 5,957,343 A | 9/1999 | Cavallaro |
| 5,971,227 A | 10/1999 | White et al. |
| 5,985,029 A | 11/1999 | Purcell |
| 6,007,631 A | 12/1999 | Prentice et al. |
| 6,017,392 A | 1/2000 | Cavallaro |
| 6,025,689 A | 2/2000 | Prentice et al. |
| 6,056,190 A | 5/2000 | Foulke et al. |

(Continued)

FOREIGN PATENT DOCUMENTS

| | | |
|---|---|---|
| EP | 1 479 451 A2 | 11/2004 |
| WO | 01/33933 A1 | 5/2001 |
| WO | 2012/099147 A1 | 7/2012 |

OTHER PUBLICATIONS

Notification of Transmittal of the International Search Report and the Written Opinion of the International Searching Authority from corresponding PCT/US2013/068477 mailed Mar. 4, 2014.

*Primary Examiner* — Hezron E Williams
*Assistant Examiner* — Rodney T Frank
(74) *Attorney, Agent, or Firm* — Lando & Anastasi, LLP

(57) ABSTRACT

A method of calibrating a dispenser of the type having a material dispensing unit that is configured to dispense material on a substrate includes providing a weigh scale having a plate configured to receive material dispensed on the plate, dispensing one or more patterns of material on the plate; weighing the amount of material dispensed on the plate, and comparing the weighed amount of material to a designated amount of material. The act of dispensing one or more patterns of material replicates at least a portion of patterns of material dispensed on the substrate during a dispensing operation. A controller for performing the method is further disclosed.

16 Claims, 4 Drawing Sheets

(56) References Cited

U.S. PATENT DOCUMENTS

| | | |
|---|---|---|
| 6,082,289 A | 7/2000 | Cavallaro |
| 6,085,943 A | 7/2000 | Cavallaro et al. |
| 6,093,251 A | 7/2000 | Carr et al. |
| 6,112,588 A | 9/2000 | Cavallaro et al. |
| 6,119,895 A | 9/2000 | Fugere et al. |
| 6,157,157 A | 12/2000 | Prentice et al. |
| 6,170,737 B1 | 1/2001 | Foulke et al. |
| 6,206,964 B1 | 3/2001 | Purcell et al. |
| 6,214,117 B1 | 4/2001 | Prentice et al. |
| 6,216,917 B1 | 4/2001 | Crouch |
| 6,224,671 B1 | 5/2001 | Cavallaro |
| 6,224,675 B1 | 5/2001 | Prentice et al. |
| 6,258,165 B1 | 7/2001 | Cavallaro |
| 6,322,854 B1 | 11/2001 | Purcell et al. |
| 6,371,339 B1 | 4/2002 | White et al. |
| 6,378,737 B1 | 4/2002 | Cavallaro et al. |
| 6,391,378 B1 | 5/2002 | Carr et al. |
| 6,395,334 B1 | 5/2002 | Prentice et al. |
| 6,412,328 B1 | 7/2002 | Cavallaro et al. |
| 6,427,903 B1 | 8/2002 | Foulke et al. |
| 6,444,035 B1 | 9/2002 | Nowak et al. |
| 6,514,569 B1 | 2/2003 | Crouch |
| 6,540,832 B2 | 4/2003 | Cavallaro |
| 6,541,063 B1 | 4/2003 | Prentice et al. |
| 6,641,030 B1 | 11/2003 | Freeman et al. |
| 6,644,238 B2 | 11/2003 | Watts et al. |
| 6,688,458 B2 | 2/2004 | Prentice et al. |
| 6,739,483 B2 | 5/2004 | White et al. |
| 6,775,879 B2 | 8/2004 | Bibeault et al. |
| 6,814,810 B2 | 11/2004 | Prentice et al. |
| 6,866,881 B2 | 3/2005 | Prentice et al. |
| 6,902,052 B2 | 6/2005 | Prentice et al. |
| 6,932,280 B2 | 8/2005 | Crouch |
| 7,404,861 B2 | 7/2008 | Prentice et al. |
| 7,833,572 B2 | 11/2010 | Read |
| 7,923,056 B2 | 4/2011 | Read |
| 7,980,197 B2 | 7/2011 | Prentice et al. |
| 8,136,705 B2 | 3/2012 | Tracy et al. |
| 8,230,805 B2 | 7/2012 | Read |
| 8,424,720 B2 | 4/2013 | Tracy et al. |
| 2006/0193969 A1 | 8/2006 | Prentice et al. |
| 2012/0240658 A1 | 9/2012 | Tracy |
| 2013/0133574 A1 | 5/2013 | Doyle et al. |
| 2013/0136850 A1 | 5/2013 | Doyle et al. |
| 2013/0177702 A1 | 7/2013 | Crouch et al. |

METHOD AND APPARATUS FOR CALIBRATING A DISPENSER

BACKGROUND OF THE INVENTION

1. Field of the Disclosure

This disclosure relates generally to methods and apparatus for dispensing a viscous material on a substrate, such as a printed circuit board, and more particularly to a method and an apparatus for calibrating or otherwise verifying an amount of material dispensed on a substrate with enhanced efficiency.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing very small amounts, or dots, of viscous material onto a circuit board. The viscous material may include solder paste or liquid epoxy, or some other related material.

There are known methods for calibrating a dispensing system to accurately control the rate and amount of viscous material that is dispensed from a dispensing unit of the dispensing system. One issue is that solder paste, for example, is difficult to dispense for calibrating the accuracy of the dispensing system since the amount of solder paste deposited cannot be accurately controlled. A quantity of material may be dispensed and weighed to determine if the unit is dispensing the desired amount of material for a given configuration of the system. One approach is to adjust the speed of the gantry carrying the dispensing head based on the weighed sample or samples to vary the amount deposited by the dispensing system. Another approach is to adjust the shot size dispensed by the dispensing head. One such system is shown and described in U.S. patent application Ser. No. 13/072,355, filed on Mar. 25, 2011, and entitled METHOD AND APPARATUS FOR CALIBRATING DISPENSED DEPOSITS, which is owned by the assignee of the present disclosure and incorporated herein by reference in its entirety for all purposes.

Another approach is described in U.S. patent application Ser. No. 13/598,719, filed on Aug. 30, 2012, and entitled METHOD AND APPARATUS FOR CALIBRATING DISPENSED DEPOSITS, which is owned by the assignee of the present disclosure and incorporated herein by reference in its entirety for all purposes. With this approach, a line of material, such as solder paste, is dispensed which has a material dispensing unit that is configured to dispense material on a substrate. Next, one or more images of the line are taken by an imaging system, and an average line width of the line is calculated. After determining the average line width, it is compared to a desired line width, which may be predetermined. The dispensing system includes a controller that is configured to perform the method and to provide closed loop determination on whether a proper amount of material is dispensed by the dispensing system.

BRIEF SUMMARY OF THE INVENTION

One aspect of the present disclosure is directed to a method of calibrating a dispenser of the type having a material dispensing unit that is configured to dispense material on a substrate. In one embodiment, the method comprises: providing a weigh scale having a plate configured to receive material dispensed on the plate; dispensing one or more patterns of material on the plate; weighing the amount of material dispensed on the plate; and comparing the weighed amount of material to a designated amount of material. The act of dispensing one or more patterns of material replicates at least a portion of patterns of material dispensed on the substrate during a dispensing operation.

Embodiments of the method further may include adjusting a parameter of the dispenser to vary an amount of material dispensed in the event the weighed amount is outside the predetermined tolerance. Adjusting the parameter of the dispenser may include adjusting a speed of the gantry. Adjusting the parameter of the dispenser also include adjusting a rotation of an auger screw of the dispensing unit or by adjusting a shot size of the dispensing unit. Comparing the weighed amount of material to the designated amount of material may include determining whether the weighed amount of material is within a predetermined tolerance. If the weighed amount of material is outside the predetermined tolerance, the method further may include repeating dispensing, weighing and comparing until the weighed amount is within the predetermined tolerance. The method further may include displaying the weight of the pattern dispensed to a user using a user interface device. The user interface device may include a display coupled to a dispenser controller. In one embodiment, the dispensing unit may be an auger-type dispenser. In another embodiment, the dispensing unit may be a jetter-type dispenser.

Another aspect of the disclosure is directed to a controller coupled to a dispenser of the type having a material dispensing unit that is configured to dispense material on a substrate. In one embodiment, the controller comprises a calibration component configured to perform acts of dispensing one or more patterns of material on a plate of a weigh scale of the dispenser, weighing the amount of material dispensed on the plate, and comparing the weighed amount of material to a designated amount of material. The act of dispensing one or more patterns of material replicates at least a portion of patterns of material dispensed on the substrate during a dispensing operation.

Embodiments of the controller further may include adjusting a parameter of the dispenser to vary an amount of material dispensed in the event the weighed amount is outside the predetermined tolerance. Adjusting the parameter of the dispenser may include adjusting a speed of the gantry. Adjusting the parameter of the dispenser may include adjusting a rotation of an auger screw of the dispensing unit or by adjusting a shot size of the dispensing unit. Comparing the weighed amount of material to the designated amount of material may include determining whether the weighed amount of material is within a predetermined tolerance. If the weighed amount of material is outside the predetermined tolerance, the method further may include repeating dispensing, weighing and comparing until the weighed amount is within the predetermined tolerance. The method further may include displaying the weight of the pattern dispensed to a user using a user interface device. The user interface device may include a display coupled to the controller. In one embodiment, the dispensing unit may be an auger-type dispenser. In another embodiment, the dispensing unit may be a jetter-type dispenser.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
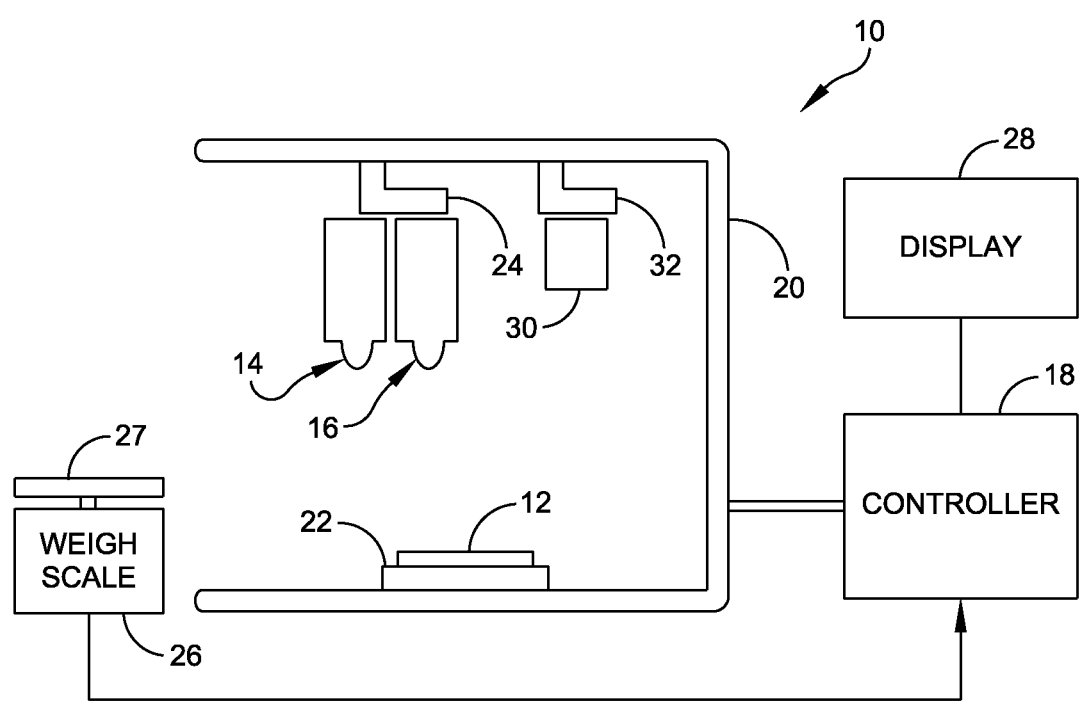
FIG. 1 is a side schematic view of a dispenser in accordance with one embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to viscous material dispensing systems, devices including dispensing systems, and methods of determining the amount dispensed by such dispensing systems. Such dispensing systems are often used to dispense solder paste, which can be difficult to dispense since the viscosity of the solder paste causes it to adhere a needle of the dispenser when dispensing a small quantity of material for weighing purposes. It has been found that simply weighing a deposited sample in a weigh cup does not accurately measure the amount of material being deposited during a dispensing operation. Specifically, with prior systems and methods, the dispenser is moved over a weigh station to deposit a sample. Once positioned above the weigh station, the dispenser deposits a known quantity into a weigh cup supported on the weigh station. This deposited amount is weighed and a controller of the dispenser compares the weighed amount to a predetermined amount stored within the controller. If the weighed amount is not within a predetermined tolerance, the dispenser is adjusted by either slowing the movement of the dispenser as it deposits material on the substrate or by increasing or decreasing the amount dispensed by the dispenser during the dispensing operation.

One shortcoming with this known approach is that the dispenser is static during the calibration sub-routine. The static nature of the dispenser causes the material being dispensed, e.g., solder paste, to be impeded while dispensing material during the calibration sub-routine. Material flows more consistently when the dispenser is moving. The present disclosure is directed to mimicking the movement of the dispenser during a calibration sub-routine to provide the adhesion experienced between the material and the substrate during a typical dispensing operation. By moving the dispenser during the calibration sub-routine, material flows out of the dispenser more consistently thereby achieving a more accurate deposit of material on the weigh station.

FIG. 1 schematically illustrates a dispenser, generally indicated at 10, according to one embodiment of the present disclosure. The dispenser 10 is used to dispense a viscous material (e.g., solder paste, adhesive, encapsulent, epoxy, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications. It should be understood that references to viscous or semi-viscous materials, as used herein, are exemplary and intended to be non-limiting.

The dispenser 10 includes at least one dispensing unit or head, generally indicated at 14, an optional dispensing unit or head, generally indicated at 16, and a controller 18 to control the operation of the dispenser. Although two dispensing units are shown, it should be understood that any number of dispensing units may be provided. The dispenser 10 may also include a frame 20 having a base 22 for supporting the substrate 12, and a dispensing unit gantry 24 movably coupled to the frame 20 for supporting and moving the dispensing unit 14. The arrangement is that during a dispense operation, the dispensing unit gantry moves the dispensing units over the substrate to dispense material on the substrate.

The dispenser 10 further includes a weight measurement device or weigh scale (or weigh station) 26 for weighing dispensed quantities of the viscous material, for example, as part of a calibration procedure, and providing weight data to the controller 18. The weigh scale 26 includes a plate 27 upon which material is deposited for weighing and for calibrating the accuracy of the dispenser. In one embodiment, the size of the plate is 4½ centimeters (cm) by 7 cm; however, any sized plate may be provided to receive material for weighing A conveyor system (not shown) or other transfer mechanism such as a walking beam may be used in the dispenser 10 to control loading and unloading of circuit boards to and from the dispenser. The gantry 24 can be moved using motors under the control of the controller 18 to position the dispensing unit 14 and/or 16 at predetermined locations over the circuit board. The dispenser 10 may optionally include a display unit or display 28 connected to the controller 18 for displaying various information to a user. There may be an optional second controller for controlling the second dispensing unit 16.

Prior to performing a dispensing operation, as described above, the electronic substrate, e.g., printed circuit board, must be aligned or otherwise in registration with the dispensing unit of the dispenser. The dispenser further includes a vision system 30, which is coupled to a vision system gantry 32 movably coupled to the frame 20 for supporting and moving the vision system. As described, the vision system 30 is employed to verify the location of landmarks, known as fiducials, on the substrate. Once located, the controller can be programmed to manipulate the movement of the dispensing unit 14 and/or 16 to dispense material on the electronic substrate. The vision system 30 can also be used to inspect boards upon which assembly material is deposited to ensure that the material is deposited on the correct locations.

Each dispensing unit 14, 16 may be configured to dispense very small amounts or dots onto a circuit board. In one system capable of dispensing dots of material, the dispensing unit 14 and/or 16 utilizes a rotating auger having a helical groove to force material out of a nozzle and onto a circuit board. One such system is disclosed in U.S. Pat. No. 5,819,983, entitled LIQUID DISPENSING SYSTEM WITH SEALING AUGERING SCREW AND METHOD FOR DISPENSING, which is owned by Speedline Technologies, Inc. of Franklin, Mass., a subsidiary of the assignee of the present disclosure. In an operation employing an auger-type dispenser, the dispenser unit is lowered towards the surface of the circuit board prior to dispensing a dot or a line of material onto the circuit board and raised after dispensing the dot or line of material. Using this type of dispenser, small, precise quantities of material may be placed with great accuracy. The time required to lower and raise the dispenser unit in a direction normal to the circuit board, typically known as a z-axis movement, can contribute to the time required to perform dispensing operations. Specifically, with auger-type dispensers, prior to dispensing the dot or line of material, the dispenser unit is lowered so that the material touches or "wets" the circuit board. The process of wetting contributes to additional time to perform the dispensing operation.

It is also known in the field of automated dispensers to launch or jet dots of viscous material toward the circuit board. In such a jetter-type system, a minute, discrete quantity of viscous material is ejected from a nozzle with sufficient momentum to enable the material to separate from the nozzle prior to contacting, or while contacting, the circuit board. As discussed above, with the auger-type application or other prior, traditional dispensers, it is necessary to wet the circuit board with the dot of material prior to releasing the dot from the nozzle. When ejecting, the dots may be deposited on the substrate without wetting as a pattern of discrete dots, or alternatively the dots may be placed sufficiently close to each other to cause them to coalesce into more or less a continuous pattern. One such jetter-type system is disclosed in U.S. Pat. No. 7,980,197, entitled METHOD AND APPARATUS FOR DISPENSING A VISCOUS MATERIAL ON A SUBSTRATE, which is owned by Illinois Tool Works Inc. of Glenview, Ill., the assignee of the present disclosure.

In one embodiment, the dispenser 10 is configured to dispense viscous material using a conventional "streaming" technique, wherein the dispenser launches discrete amounts, or shots, of the material toward the substrate at a controlled volumetric flow rate for each deposit. The dispenser 10 may be configured to dispense varying amounts of material in a controllable manner. It is appreciated that the amount of material dispensed in a given configuration of the dispenser 10 may vary with respect to the viscosity of the material being dispensed. For example, materials with a higher viscosity tend to be more resistive to flow than materials with lower viscosity, thus affecting the flow rate of the dispenser 10 in a given configuration and for a given material. Further, the viscosity of a particular material may vary over relatively short periods of time (e.g., hours) due to changes in the temperature or other properties of the material, or as a consequence of variations in composition (e.g., between different batches of the material), which further affects the flow rate and, accordingly, the quantity of material deposited per shot. Therefore, according to some aspects, the amount of material dispensed by the dispenser 10 in a given configuration can be determined as a function of the viscosity of the material at the time it is being dispensed. One exemplary function will be described below.

Since it can be important to carefully control the amount of material being dispensed, the dispenser 10 should be calibrated prior to, or during, use to ensure that the desired quantity of material may be dispensed in a predictable manner. According to one embodiment, information gathered during the calibration process may be used, on a periodic or continuous basis, to automatically adjust the dispenser 10 to maintain a desired volumetric flow in response to variations in the viscosity of the material.

One calibration process includes weighing samples of material dispensed by the dispensing head 14 and/or 16. For example, a series of samples may be dispensed and weighed. An output function can therefore be derived from this sample data that describes the expected output of the dispenser in a given configuration for a given material having a given viscosity. Using the derived output function, a calibrated dispense operation which produces a desired quantity (or weight) of dispensed material may be determined with reasonable accuracy at least for the dispensing head 14 and/or 16 from which the samples were taken.

In at least one embodiment, it is appreciated that where two or more dispensing heads, each being substantially identical in configuration, are used to dispense the same or similar material, the output characteristics of one dispensing head relative to another may be substantially similar such that the output functions of each head are nearly identical. In some of these embodiments, any differences between the output functions of the multiple dispensing heads can be accounted for by applying an offset variable to the derived output function of one of the dispensing heads. For example, if the output of a first dispensing head is described by y=f(x), the output of a second dispensing head can be described by y=f(x)+offset with reasonable accuracy, provided that both the first and second heads are dispensing the same material having substantially the same viscosity. The offset can be used to quickly apply calibration adjustments to the dispenser 10. For example, it is known that the viscosity of a material can change over the course of a few hours. Therefore it may be advantageous to recalibrate the dispenser 10 at periodic intervals of operation to help ensure that the actual output is within desired tolerances. The output function for each dispensing head may be derived independently. Each dispensing head may be calibrated independently to match a target to within a specified tolerance. Once calibrated, an offset ratio may be calculated to mach outputs of the dispensing heads.

One exemplary configuration procedure of the dispenser 10 will now be described according to various embodiments of the present disclosure. In one embodiment, the configuration procedure enables a user to configure the dispenser 10 to dispense a specific amount of material per shot, and further to enable the dispenser to measure and/or apply corrections, if necessary, such that the output of the dispenser remains substantially the same over a period of time (e.g., one day of operation) to account for any changes in the viscosity (or other property) of the material. In another embodiment, the configuration procedure enables the user to calibrate a dispenser 10 having two dispensing heads to ensure that the output of both heads is substantially the same.

According to various embodiments, it is appreciated that in situations where multiple dispensers are performing similar dispensing operations (e.g., in a shop having multiple dispensing machines running at the same time to produce the same parts), the above described characterization process is desirable for ensuring that a consistent volume of material is dispensed for all parts from all of the dispensing machines. In some embodiments, two or more dispensing machines may be networked together such that all such networked machines can be configured from a single point.

The computer system may include an operating system that manages at least a portion of the hardware elements included in the computer system. Usually, a processor or controller executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and the embodiments disclosed herein are not intended to be limited to any particular implementation.

The processor and operating system together define a computer platform for which application programs in high level programming languages may be written. These component applications may be executable, intermediate, for example, C-, bytecode or interpreted code which communicates over a communication network, for example, the Internet, using a communication protocol, for example, TCP/IP. Similarly, aspects in accord with the present disclosure may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present disclosure may be implemented in a non-programmed environment, for example, documents created in HTML, XML or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the disclosure is not limited to a specific programming language and any suitable programming language could also be used.

Embodiments of the present disclosure, performs a calibration sub-routine by mimicking the movement of the dispensing unit 14 and/or 16 during a normal dispensing operation. Specifically, when depositing material on the plate 27 of the weigh scale 26 during a calibration sub-routine, the dispensing unit is moved in a manner similar to the movement of the dispensing unit when dispensing material on the substrate. Based on the weight of the sample of material deposited on the weigh scale 26, a speed of the dispenser gantry may be adjusted to control the amount dispensed. In another embodiment, with an auger-type dispenser, the rotational speed of an auger of the dispensing unit may be adjusted to control the amount dispensed. In yet another embodiment, with a jetter-type dispenser, the shot size of the dispensing unit may be adjusted to control the amount dispensed.

Figure 2:
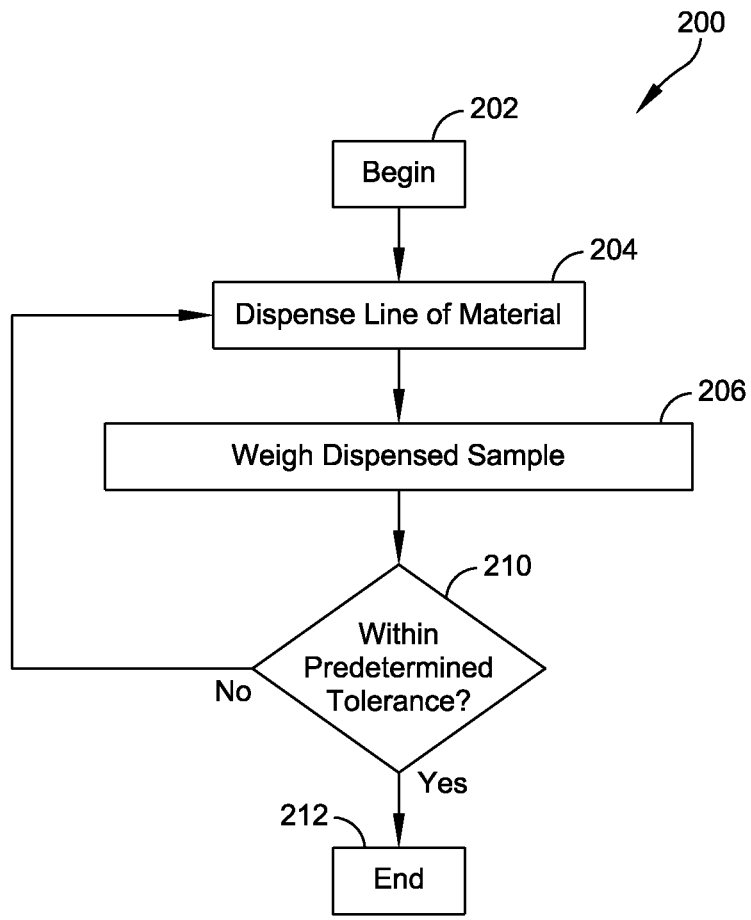
FIG. 2 is a schematic block diagram of a method of determining an amount of material dispensed on a substrate.

In one embodiment of the present disclosure, and with reference to FIG. 2, a method of determining an amount of material, e.g., solder paste, dispensed on a surface by performing a calibration sub-routine is generally indicated at 200. As shown, the method begins at 202. At 204, the dispenser is programmed under the control of the controller to dispense one or more lines or dots of material, e.g., solder paste, on the plate 27 of the weigh scale 26. The lines and/or dots of material may be referred to herein as a "pattern" of material since the pattern may include lines (long and short), dots, or both. The plate 27 is of a sufficient size so as to enable the dispenser to dispense patterns of material that have been or will be dispensed on a substrate. With large dispense operations, the calibration sub-routine 200 can be shortened so that a portion of the dispensing operation is replicated on the plate or scaled down to a manageable amount. At 206, the weigh scale 26 measures the weight of the material dispensed on the plate 27, and this information is communicated to the controller 18. At 210, the controller 18 determines whether the material dispensed is within a predetermined tolerance, which may be pre-programmed within the controller. If the amount of material is within the predetermined tolerance, e.g., within +/−ten percent (10%) of the known weight of material, then the method ends at 212. If the amount of material is not within the predetermined tolerance, a parameter of the dispenser 10 is adjusted, such as the speed of the gantry, and the process is repeated at 204 until the amount of material is within the predetermined tolerance. In another embodiment, the rotational speed of the auger screw for an auger-type dispenser may be adjusted or the shot size of the dispenser unit may be adjusted. This process may be repeated any number of times, e.g., five.

Figure 3A:
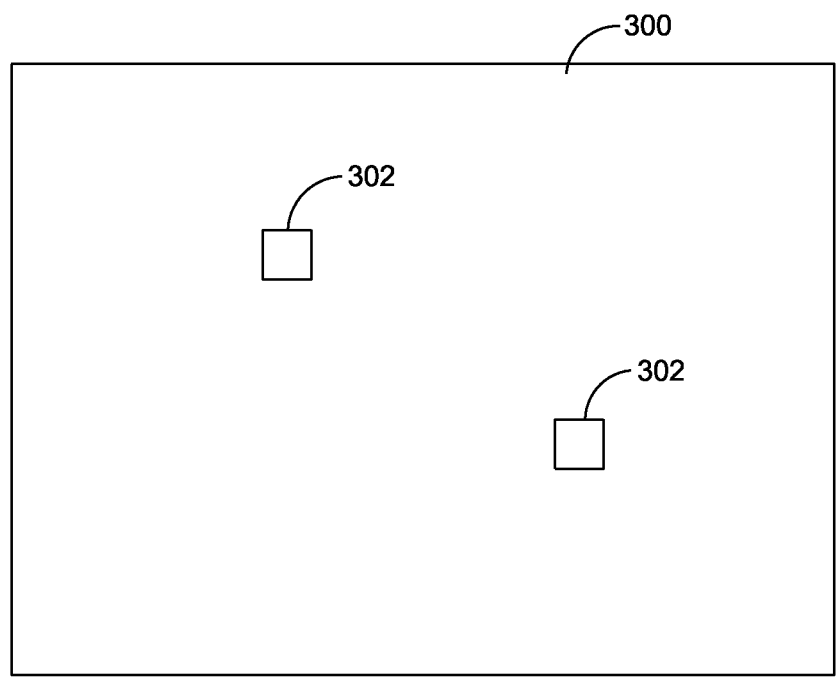
FIG. 3A is a top view of a substrate having two features dispensed on the substrate.

In one example, a substrate 300 is illustrated in FIG. 3A. As shown, the substrate 300 includes features 302 provided on a surface of the substrate. In a certain embodiment, the features 302 are patterns (e.g., lines) of solder paste dispensed on the substrate 300 on which other components may be mounted. In other embodiments, as mentioned above, the features may embody any type of shape or size, including lines, shortened lines, dots, and the like. For example, electronic components, such as microchips, may be mounted on the substrate by positioning the components on the features and subjecting the substrate to a heat treatment process to mechanically and electrically secure the components to the substrate.

Figure 3B:
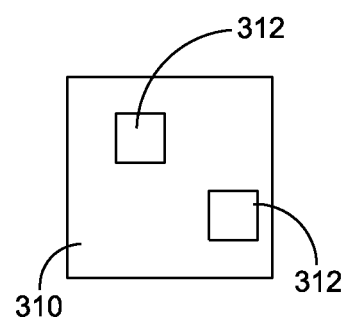
FIG. 3B is a top view of a plate of a weigh scale having two features dispensed on the plate.

FIG. 3B illustrates a plate 310 having features 312 deposited on the surface of the plate. In one embodiment, the plate is a one inch by one inch plate having a surface on which material is dispensed. In the shown example, the features 312 are identical to the features 302 deposited on the substrate 300. Thus, the amount of material deposited on the plate 310 should replicate the exact amount of material deposited on the substrate 300. The calibration sub-routine discussed above may be performed on the sample deposited on the plate 310 to determine whether the amount of material dispensed on the plate is within a predetermined tolerance.

Figure 4:
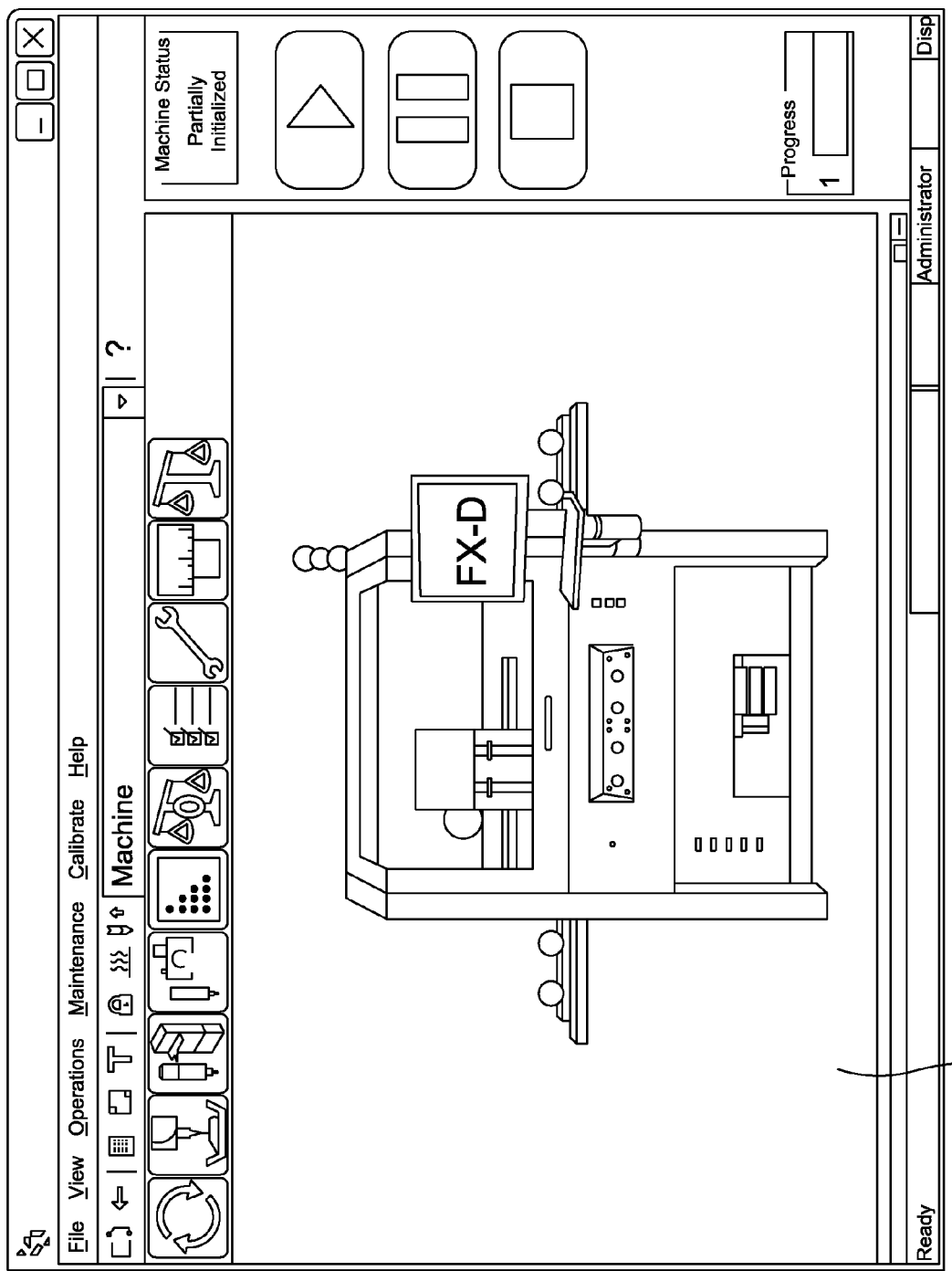
FIG. 4 is a screen shot of an exemplary user interface.

The method may further include one or more of the following features:

A dialog box may be provided on the display unit to set up the calibration sub-routine. The dialog box may be generally similar to a weigh block template. The dialog box may apply globally to all lines in the process program. In one embodiment, and with reference to FIG. 4, an exemplary dialog box is shown. Specifically, FIG. 4 illustrates a user interface 400 that a user engages to initiate a calibration sub-routine.

Dots of material may be adjusted by changing the rotation of the auger screw for an auger-type dispenser to dispense more or less material while the gantry is stationary.

The calibration sub-routine may apply to dispensers having auger-type dispensers and jetter-type dispensers, which may be referred to as micro-piston pumps.

During setup, an operator may specify one or more of the following parameters: (1) RPM; (2) z-axis height; (3) for auger-type dispensers the rotation in degrees per millimeter (mm) and for jetter-type dispensers the jetting rate in dots per mm (the "line width" column in a line command); (4) one or more pumps (left and/or right); (5) tolerance; (6) upper and lower limits; (7) measure every n boards or every n minutes; and (8) clean needle before dispensing. One or more icon on the display can be provided to assist an operator in performing an operation disclosed herein.

The length and/or the amount of the dispensed line may not be adjustable by the user but instead may be stored in the database of the controller.

In one embodiment, the pre-dispense plate may be part of the weigh scale or a separate component that is replaceable for positioning different size plates on the weigh scale.

During execution of the method, in a certain embodiment, the dispense location on the plate of the weigh scale may need to be determined in conjunction with any pre-dispense dots and/or pre-dispense line.

During execution of the method, in a certain embodiment, a z-axis sense operation may be executed before dispensing the line. (This may limit the dispense operation to only one pre-dispense plate.)

During execution of the method, in a certain embodiment, the calibration sub-routine may be performed as follows: (1) if the measured value is within the specified tolerance then no changes may occur; (2) if the measured value is outside the specified tolerance then, for example, with auger-type dispensers, a dispensing unit gantry speed may be adjusted or a dispense time and pressure may be adjusted and a new deposit may be dispensed on the plate; (3) continue with step (1) for a maximum of five times; (4) after the fifth attempt an alarm may be posted; and (5) should the result of any measurement be outside the upper or lower limits an alarm may be generated.

During execution of the method, if the plate is filled then the same handling currently in place for the pre-dispense dots and/or pre-dispense lines may be used.

Although the embodiment of the method discussed herein performs the method under the control of the controller, an operator of the dispenser can manually initiate a calibration sub-routine operation. In a certain embodiment, results may be stored by the controller in a separate log file.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of calibrating a dispenser of the type having a material dispensing unit that is configured to dispense material on a substrate, the method comprising:
    providing a weigh scale having a plate configured to receive material dispensed on the plate;
    dispensing one or more patterns of material on the plate;
    weighing the amount of material dispensed on the plate;
    comparing the weighed amount of material to a designated amount of material,
    wherein dispensing one or more patterns of material replicates at least a portion of patterns of material dispensed on the substrate during a dispensing operation; and
    displaying the weight of the pattern dispensed to a user using a user interface device having a display coupled to a dispenser controller,
    wherein during setup, an operator specifies the following parameters: a speed of a dispenser gantry; a number of dispensers; a z-axis height of each dispenser; for auger-type dispensers, a rotation of an auger screw in degrees per millimeter, or for jetter-type dispensers, a jetting rate in dots per millimeter; a predetermined tolerance of the weight of the pattern dispensed; a measure of every n boards or every n minutes; and when to perform a needle cleaning operation, and
    wherein one or more icons are provided on the display to assist the operator.

2. The method of claim 1, wherein comparing the weighed amount of material to the designated amount of material includes determining whether the weighed amount of material is within the predetermined tolerance.

3. The method of claim 2, wherein if the weighed amount of material is outside the predetermined tolerance, further comprising repeating dispensing, weighing and comparing until the weighed amount is within the predetermined tolerance.

4. The method of claim 2, further comprising adjusting a parameter of the dispenser to vary an amount of material dispensed in the event the weighed amount is outside the predetermined tolerance.

5. The method of claim 4, wherein adjusting the parameter of the dispenser includes adjusting the speed of the dispenser gantry.

6. The method of claim 4, wherein adjusting the parameter of the dispenser includes adjusting the rotation of the auger screw of the dispensing unit or by adjusting a shot size of the dispensing unit.

7. The method of claim 1, wherein the dispensing unit is an auger-type dispenser.

8. The method of claim 1, wherein the dispensing unit is a jetter-type dispenser.

9. A controller coupled to a dispenser of the type having a material dispensing unit that is configured to dispense material on a substrate, the controller comprising:
    a calibration component configured to perform acts of
        dispensing one or more patterns of material on a plate of a weigh scale of the dispenser,
        weighing the amount of material dispensed on the plate,
        comparing the weighed amount of material to a designated amount of material,
        wherein dispensing one or more patterns of material replicates at least a portion of patterns of material dispensed on the substrate during a dispensing operation,
        displaying the weight of the pattern dispensed to a user using a user interface device having a display coupled to a dispenser controller,
        wherein during setup, an operator specifies the following parameters: a speed of a dispenser gantry; a number of dispensers; a z-axis height of each dispenser; for auger-type dispensers, a rotation of an auger screw in degrees per millimeter, or for jetter-type dispensers, a jetting rate in dots per millimeter; a predetermined tolerance of the weight of the pattern dispensed; a measure of every n boards or every n minutes; and when to perform a needle cleaning operation, and
        wherein one or more icons are provided on the display to assist the operator.

10. The controller of claim 9, wherein comparing the weighed amount of material to the designated amount of material includes determining whether the weighed amount of material is within the predetermined tolerance.

11. The controller of claim 10, wherein if the weighed amount of material is outside the predetermined tolerance, further comprising repeating dispensing, weighing and comparing until the weighed amount is within the predetermined tolerance.

12. The controller of claim 10, further comprising adjusting parameter of the dispenser to vary an amount of material dispensed in the event the weighed amount is outside the predetermined tolerance.

13. The controller of claim 12, wherein adjusting the parameter of the dispenser includes adjusting the speed of the dispenser gantry.

14. The controller of claim 12, wherein adjusting the parameter of the dispenser includes adjusting the rotation of the auger screw of the dispensing unit or by adjusting a shot size of the dispensing unit.

15. The controller of claim 9, herein the dispensing unit is an auger-type dispenser.

16. The controller of claim 9, wherein the dispensing unit is a jetter-type dispenser.

* * * * *

UNITED STATES PATENT AND TRADEMARK OFFICE
CERTIFICATE OF CORRECTION

PATENT NO. : 9,057,642 B2
APPLICATION NO. : 13/692057
DATED : June 16, 2015
INVENTOR(S) : Jonathan Joel Bloom et al.

It is certified that error appears in the above-identified patent and that said Letters Patent is hereby corrected as shown below:

In the Claims:

Column 10, claim 12, line 58, before "parameter" add --a--;

Column 11, claim 15, line 1, replace "herein" with --wherein--.

Signed and Sealed this
Tenth Day of November, 2015

Michelle K. Lee
*Director of the United States Patent and Trademark Office*